United States Patent [19]

Bergero

[11] 4,255,724
[45] Mar. 10, 1981

[54] DISTORTION-CORRECTOR FOR MICROWAVE TUBES

[75] Inventor: Jean-Pierre Bergero, Paris, France
[73] Assignee: Thomson-CSF, Paris, France
[21] Appl. No.: 964,663
[22] Filed: Nov. 29, 1978

[30] Foreign Application Priority Data

Dec. 2, 1977 [FR] France ............................... 77 36331

[51] Int. Cl.³ ....................... H03H 7/20; H03H 7/34; H03H 21/00
[52] U.S. Cl. ................................. 333/17 L; 328/155; 330/149; 333/18; 333/139; 333/156; 333/171
[58] Field of Search ..................... 333/17 R, 17 L, 18, 333/174, 138, 139, 81 R, 172, 28 R, 140, 156, 171; 307/295, 317 R, 317 A; 330/149; 328/155

[56] References Cited

U.S. PATENT DOCUMENTS

| 3,524,081 | 8/1970 | Campanella | 307/295 X |
| 3,670,214 | 6/1972 | Hagen | 357/15 |
| 3,849,676 | 11/1974 | Bareyt | 307/295 |

OTHER PUBLICATIONS

Rogers–"The Theory of Networks In Electrical Communication and Other Fields", MacDonald, London, 1958, Title Page and pp. 436–440.

Primary Examiner—Marvin L. Nussbaum
Attorney, Agent, or Firm—Roland Plottel

[57] ABSTRACT

A distortion-corrector which comprises a filter of the low-pass type, of the $\pi$ or T configuration, and two diodes, in parallel opposition, disposed between the input and output of the filter. This corrector compensates amplitude-and-phase- distortions of the tube associated with the corrector, over a given operational frequency-band of the tube which is below the cut-off frequency of the filter, by compressing weak signals, for which no diode conducts, with respect to strong signals, for which there is at least a start of conduction of one of the diodes and by producing a phase-lead which increases with the input power of the tube.

7 Claims, 4 Drawing Figures

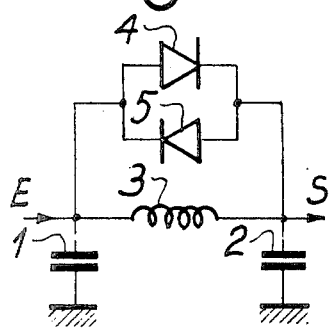
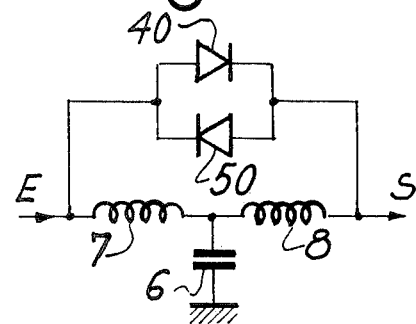
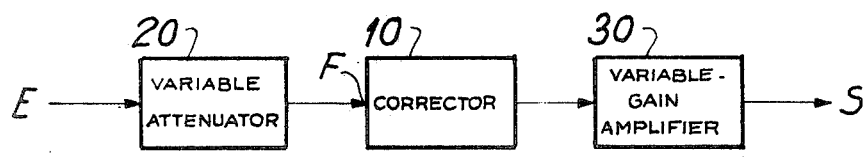
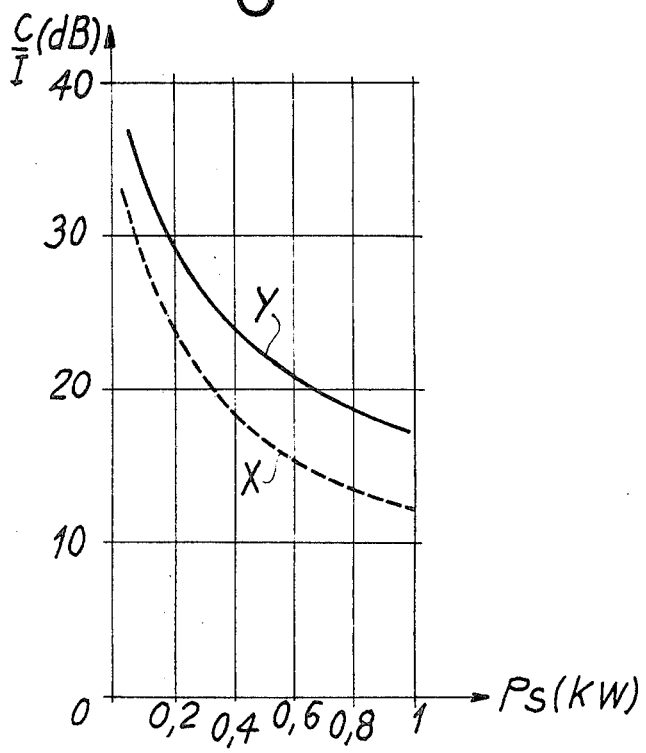

DISTORTION-CORRECTOR FOR MICROWAVE TUBES

The present invention concerns a distortion-corrector for microwave amplifier tubes, and more particularly for travelling-wave power tubes.

These microwave tubes introduce the following forms of distortions:

the amplitude of the output power n which first of all increases in proportion to the input power, subsequently becomes fixed at a maximum value, called the saturation value;

the phase-lag in the output power increases with the input power.

These distortions are particularly unpleasant when signals of different frequencies are simultaneously amplified, since supplementary signals called intermodulation products then appear, the frequencies of said supplementary signals being close to those of the useful signals and thus spoiling the quality of transmission.

In order to reduce the effect of these distortions, these microwave tubes may be used with the output power limited to a value much lower than the saturation value. Since the consumption of the tube remains substantially constant, this type of operation greatly reduces the efficiency.

It is also known to compensate for distortion in the microwave tubes in question by a device disposed before the tube and called a two-channel corrector.

In two-channel correctors, the signal to be pre-corrected is supplied simultaneously to a first channel using the nonlinearity in the current-voltage characteristics of diodes in order to produce amplitude distortion, and to a second channel which introduces a phase-shift of 90° with respect to the first.

Combining the signals emanating from these two channels makes it possible to produce distortion opposite to that of the tube being used.

U.S. Pat. No. 3,849,676, in the name of THOMSON-CSF, deals with correctors of this type.

The practical embodiment of two-channel correctors requires, besides diodes, numerous passive components such as couplers, attenuators, phase-shifters and ferrite circulators, which is a disadvantage.

Numerous adjustments are furthermore required in order to optimise the performance of the tube associated with the corrector over the operational frequency-band.

The corrector according to the invention has the advantages of being made of a small number of passive components, and of being easy to adjust.

The corrector according to the invention comprises a filter of the low-pass type, of the $\pi$ or T configuration for example, and two diodes, in parallel opposition, disposed between the input and output of the filter. This corrector compensates amplitude- and phase-distortions of the tube associated with the corrector, over a given operational frequency-band of the tube which is below the cut-off frequency of the filter, by compressing weak signals, for which no diode conducts, with respect to strong signals, for which there is at least a start of conduction of one of the diodes and by producing a phase-lead which increases with the input power of the tube.

The invention will be better understood with reference to the following description and to the appended drawings, wherein:

FIG. 1 illustrates the circuit diagram of one form of embodiment of a corrector according to the invention;

FIG. 2 illustrates the circuit diagram of another form of embodiment of a corrector according to the invention;

FIG. 3 illustrates a device for using a corrector according to the invention;

FIG. 4 illustrates two curves depicting the improvement in performance of a travelling-wave tube due to the use of a corrector according to the invention.

FIG. 1 illustrates in non-limitative fashion the circuit diagram of one form of embodiment of a corrector according to the invention.

In this form of embodiment, the corrector according to the invention consists of a $\pi$ filter of the low-pass type comprising two condensers 1 and 2 in its vertical branches and an inductance 3 in its horizontal branch; in parallel with this horizontal branch, and disposed between the input and output of the filter, there is a unit consisting of two diodes 4 and 5 in parallel opposition.

In the following of the text, the signal E will represent the signal to be pre-corrected, that is to say the input signal of the corrector or of the corrector device according to the invention, and the signal S the pre-corrected signal supplied to the microwave tube and obtained at the output of the corrector or of the corrector device according to the invention.

The diodes 4 and 5 may be of the Schottky type for example.

The condensers 1 and 2, which take the form of variable-length open lines, are adjusted so that the cut-of frequency of the filter is higher than the operational frequency-band of the tube in use. Correctors, according to the invention are, for example, used to correct distortions in microwave tubes over the frequency band from 5925 to 6425 MHz, which is the telecommunication band.

At a given frequency, when the power supplied to the input of the corrector is not sufficient for one of the diodes 4 or 5 to start to conduct, the output power of the corrector tends to be proportional to its input power.

When the input power of the corrector becomes sufficient for one of the diodes 4 or 5 to start to conduct, the resistance of the horizontal branch of the filter drops sharply, thus causing the output power to increase more rapidly than in the foregoing case in which the diodes were not conducting.

The corrector forming the subject of the invention therefore tends to compress weak signals with respect to strong signals.

It therefore makes it possible to correct amplitude distortion in a microwave tube such as a travelling-wave tube or T.W.T. over a given operational frequency-band of the tube.

As regards phase-distortion, it is found that the corrector forming the subject of the invention produces a phase-lead which increases with the input power, and which is therefore the opposite to that of a T.W.T. for example. This phase-lead is a function of the cut-off frequency of the filter and the relative values of its components.

The corrector forming the subject of the invention therefore makes it possible to correct amplitude- and phase-distortions in a microwave tube such as a T.W.T. over a given operational frequency-band of the tube.

FIG. 2 shows another form of embodiment of a corrector according to the invention, giving similar results.

In the example of FIG. 2, the corrector according to the invention takes the form of a T filter of the low-pass type, comprising two inductances 7 and 8 in its horizontal branch and a condenser 6 in its vertical branch connected to the junction of the two inductances. Between the input and output of the filter there is a unit consisting of two diodes 40 and 50 in parallel opposition.

In FIG. 3, the corrector according to the invention is disposed between a variable attenuator 20 and a variable-gain amplifier 30.

The attenuator 20 and the amplifier 30 are standard commercial components.

The signal F obtained at the output of the attenuator 20 is supplied to the corrector 10.

The amplifier 30 has the purpose of compensating for the attenuation imparted by the attenuator 20 to the input signal E.

By virtue of the variable attenuator 20, the device illustrated in FIG. 3 enable the input of the corrector 10 to be supplied with signals F of different values for a given value of the signal E, thus allowing the current-voltage characteristic of the diodes 4 and 5 or 40 and 50 to be used at different points. It is therefore possible, for a given value of the signal E, to adapt the amplitude and phase of the output signal of the corrector 10 to the microwave tube to be corrected.

FIG. 4 depicts the improvement in the performance of a T.W.T. due to the use of a corrector of the type illustrated by FIG. 1.

The T.W.T. used has a saturation power, with a single carrier, of the order of 1500 W.

FIG. 4 illustrates the variations in the C/I ratio in decibels, measured in the case of intermodulation between two carriers of equal amplitude and 5 MHz apart (the carriers used in this example are on 6100 and 6105 MHz), as a function of the total output power of the T.W.T. $P_s$, in kilowatts. The C/I ratio was measured in the case in which the T.W.T. was used without distortion-correction, curve X, and in the case in which the T.W.T. was preceded by a correction device according to the invention, curve Y.

The C/I ratio represents the ratio in one channel between the useful power of the carrier C and the sum I of the powers contributed by the intermodulation products of the 3rd, 5th . . . orders.

The C/I ratio increases as the intermodulation decreases.

On the curves X and Y, the C/I ratio decreases as the output power increases, since the intermodulation increases as the T.W.T. approaches saturation.

For a given output power, the value of C/I on curve Y is greater than the value of C/I on curve X.

Over a given operational frequency-band of the tube, the corrector according to the invention enables intermodulation to be reduced for a given output power, or power output to be increased for a given level of intermodulation, the power output is therefore practically doubled while keeping an intermodulation ratio better than 25 dB.

The corrector according to the invention has been used in order to correct distortions in T.W.Ts. of various powers and operational frequencies, and in various microwave amplifier tubes such as klystrons.

The corrector according to the invention may for example correct distortion in T.W.Ts. used in ground stations for satellite telecommunications.

What is claimed, is:

1. Distortion-corrector for microwave tubes which comprises:

a filter of the low-pass type, having an input and an output;

two diodes connected in parallel opposition, said two diodes being disposed between the input and output of the filter; this corrector compensating amplitude- and phase-distortions of the tube associated with the corrector, over a given operational frequency-band of the tube which is below the cut-off frequency of the filter, by compressing weak signals, for which no diode conducts, with respect to strong signals, for which there is at least a start of conduction of one of the diode, and by producing a phase-lead which increases with the input power of the filter.

2. Distortion-corrector according to claim 1, wherein the filter of the low-pass type is a $\pi$ filter, comprising a condenser in each of its vertical branches and an inductance in its horizontal branch.

3. Distortion-corrector according to claim 1, wherein the filter of the low-pass type is a T filter, comprising two inductances in its horizontal branch and a condenser in its vertical branch connected to the junction of the two inductances.

4. Distortion-corrector according to claim 1, wherein the diodes used are of the Schottky type.

5. Distortion-corrector according to claim 2 or to claim 3, wherein the condensers are variable-length open lines.

6. Distortion-corrector according to claim 1, wherein the phase-distortion correction is adjustable by action on the cut-off frequency of the filter and on the relative values of its components.

7. Distortion-corrector device for microwave tubes which comprises:

a distortion-corrector according to claim 1;

a variable attenuator, preceding this corrector, which allows to adapt the amplitude- and phase-distortions correction to the microwave tube, associated to the corrector and operating in a given operational frequency-band;

a variable gain amplifier, following this corrector, which compensates the attenuation imparted by the attenuator to the input signal of the distortion-corrector device.

* * * * *